US009484112B2

United States Patent
Yu et al.

(10) Patent No.: US 9,484,112 B2
(45) Date of Patent: Nov. 1, 2016

(54) LIQUID CRYSTAL DISPLAY AND SHIFT REGISTER THEREOF

(71) Applicant: Shenzhen China Star Optoelectronics Technology Co., Ltd., Shenzhen, Guangdong (CN)

(72) Inventors: Xiaojiang Yu, Guangdong (CN); Xin Zhang, Guangdong (CN); Jun Xia, Guangdong (CN)

(73) Assignee: Shenzhen China Star Optoelectronics Technology Co., Ltd, Shenzhen, Guangsong (CN)

( * ) Notice: Subject to any disclaimer, the term of this patent is extended or adjusted under 35 U.S.C. 154(b) by 77 days.

(21) Appl. No.: 14/433,609

(22) PCT Filed: Dec. 9, 2014

(86) PCT No.: PCT/CN2014/093351
§ 371 (c)(1),
(2) Date: Apr. 3, 2015

(87) PCT Pub. No.: WO2016/086431
PCT Pub. Date: Jun. 9, 2016

(65) Prior Publication Data
US 2016/0163400 A1  Jun. 9, 2016

(30) Foreign Application Priority Data
Dec. 5, 2014  (CN) .......................... 2014 1 07370635

(51) Int. Cl.
G09G 5/00 (2006.01)
G11C 19/28 (2006.01)
G09G 3/36 (2006.01)

(52) U.S. Cl.
CPC ............. *G11C 19/28* (2013.01); *G09G 3/3648* (2013.01); *G09G 3/3674* (2013.01); *G09G 3/3677* (2013.01); *G09G 3/3685* (2013.01); *G09G 3/3696* (2013.01); *G09G 2300/0426* (2013.01); *G09G 2310/0202* (2013.01); *G09G 2310/0286* (2013.01)

(58) Field of Classification Search
CPC .... G09G 3/36; G09G 3/3648; G09G 3/3674; G09G 3/3677; G09G 3/3685; G09G 3/3696; G09G 2310/0286; G09G 2310/0202; G09G 2300/0426
USPC .................................... 345/87–100, 204–215
See application file for complete search history.

(56) References Cited

U.S. PATENT DOCUMENTS 9,183,808 B2 * 11/2015 Tsuchi ............. H03K 3/356165
9,196,213 B2 * 11/2015 Kim ..................... G09G 3/3696
(Continued)

*Primary Examiner* — Vijay Shankar
(74) *Attorney, Agent, or Firm* — Andrew C. Cheng

(57) ABSTRACT

The present invention provides a liquid crystal display and a shift register thereof. Each shift register unit of the shift register comprises a storage circuit, receiving and temporarily storing a former stage signal, a voltage level control circuit and an inverter circuit, charging and discharging scan lines of a liquid crystal display panel, and a first node exists between the voltage level control circuit and the inverter circuit, and a second node exists between the storage circuit and the voltage level control circuit, and the storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal. With the aforementioned arrangement, the present is beneficial to the narrow frame or non frame design of the liquid crystal display panel and promote the process yield.

19 Claims, 3 Drawing Sheets

(56) References Cited

U.S. PATENT DOCUMENTS

| | | | | |
|---|---|---|---|---|
| 9,363,453 B2 * | 6/2016 | Makino | ............... | H04N 5/347 |
| 2015/0235590 A1 * | 8/2015 | Peng | ............... | G09G 3/2092 |
| | | | | 327/109 |
| 2016/0189798 A1 * | 6/2016 | Chen | ............... | G11C 19/184 |
| | | | | 377/64 |

\* cited by examiner

LIQUID CRYSTAL DISPLAY AND SHIFT REGISTER THEREOF

FIELD OF THE INVENTION

The present invention relates to a liquid crystal display driving technology field, and more particularly to a liquid crystal display and a shift register thereof.

BACKGROUND OF THE INVENTION

The liquid crystal display requires proper a driving circuit. The driving circuit generally comprises a data driving circuit and a scan driving circuit. The scan driving circuit utilizes shift registers as the core circuit element in generally.

Ordinarily, the shift register comprises a plurality of shift register units connected in series. The output signal of the shift register unit of the former stage is employed as the input signal of the shift register unit of the latter stage. However, the structures of the most present single shift register units are complex. The occupied area of the shift register is larger after the plurality of the shift register units is connected in series. It is disadvantaged to the narrow frame or non frame design of the liquid crystal display panel. The complex structure can easily decrease the manufacture yield of the liquid crystal display panel.

SUMMARY OF THE INVENTION

On this account, the technical issue that the embodiment of the present invention solves is to provide a liquid crystal display and a shift register thereof, which is beneficial to the narrow frame or non frame design of the liquid crystal display panel and promote the process yield of the liquid crystal display.

For solving the aforesaid technical issues, one technical solution employed by the present invention is: to provide a shift register comprising a plurality of shift register units, wherein each shift register unit comprises a storage circuit, receiving and temporarily storing a former stage signal, a voltage level control circuit and an inverter circuit, charging and discharging scan lines of a liquid crystal display panel, and a first node exists between the voltage level control circuit and the inverter circuit, and a second node exists between the storage circuit and the voltage level control circuit, and the storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal;

wherein the storage circuit comprises an input end, a first transistor, a second transistor, a first inverter and a second inverter, and the first transistor is coupled to the input end, and a third node exists between the first transistor and the first inverter, and the second transistor is coupled to the second inverter, and the voltage level control circuit comprises a seventh transistor, an eighth transistor, and a ninth transistor, and the seventh transistor and the ninth transistor are coupled to the second node, and the eighth transistor is coupled to the first node, and the inverter circuit comprises a tenth transistor, an eleventh transistor and an output end, and the tenth transistor and the eleventh transistor are coupled to the first node, and a second end of the eleventh transistor is coupled to the output end.

A control end of the first transistor is coupled to an external circuit to receive the first sequence signal, and a first end of the first transistor is coupled to the input end to receive an output signal of a shift register unit of the former stage, and a second end of the first transistor is coupled to the third node, and a control end of the second transistor is coupled to the external circuit to receive the first sequence signal, and a first end of the second transistor is coupled to the second inverter, and a second end of the second transistor is coupled to the third node.

The first transistor is a N-type MOS, and the control end, the first end and the second end of the first transistor respectively are a gate, a source and a drain of the N-type MOS, and the second transistor is a P-type MOS, and the control end, the first end and the second end of the second transistor respectively are a gate, a source and a drain of the P-type MOS.

The first inverter comprises a third transistor and a fourth transistor, and the second inverter comprises a fifth transistor and a sixth transistor, and a control end of the third transistor is coupled to the third node, and a first end of the third transistor is coupled to the external circuit to receive a high level signal, and a second end of the third transistor is coupled to the second node, and a control end of the fourth transistor is coupled to the third node, and a first end of the fourth transistor is coupled to the external circuit to receive a low level signal, and a second end of the fourth transistor is coupled to the second node, and a control end of the fifth transistor is coupled to the second node, and a first end of the fifth transistor is coupled to the external circuit to receive a high level signal, and a second end of the fifth transistor is coupled to the second end of the second transistor, and a control end of the sixth transistor is coupled to the second node, and a first end of the sixth transistor is coupled to the external circuit to receive a low level signal, and a second end of the sixth transistor is coupled to the second end of the second transistor.

The third transistor is a P-type MOS, and the control end, the first end and the second end of the third transistor respectively are a gate, a source and a drain of the P-type MOS, and the fourth transistor is a N-type MOS, and the control end, the first end and the second end of the fourth transistor respectively are a gate, a source and a drain of the N-type MOS, and the fifth transistor is a P-type MOS, and the control end, the first end and the second end of the fifth transistor respectively are a gate, a source and a drain of the P-type MOS, and the sixth transistor is a N-type MOS, and the control end, the first end and the second end of the sixth transistor respectively are a gate, a source and a drain of the N-type MOS.

A control end of the seventh transistor is coupled to the second node, and a first end of the seventh transistor is coupled to the second node, and a second end of the seventh transistor is coupled to the first node, and a control end of the eighth transistor is coupled to an external circuit to receive the second sequence signal, and a first end of the eighth transistor is coupled to the second node, and a second end of the eighth transistor is coupled to the first node, a control end of the ninth transistor is coupled to the external circuit to receive the second sequence signal, and a first end of the ninth transistor is coupled to the second node, and a second end of the ninth transistor is coupled to the external circuit to receive a high level signal.

The seventh transistor is a N-type MOS or a P-type MOS, and the control end, the first end and the second end of the seventh transistor respectively are a gate, a source and a drain of the N-type MOS or the P-type MOS, and the eighth transistor is a N-type MOS, and the control end, the first end and the second end of the eighth transistor respectively are a gate, a source and a drain of the N-type MOS, and the ninth transistor is a P-type MOS, and the control end, the first end and the second end of the ninth transistor respectively are a gate, a source and a drain of the P-type MOS.

A control end of the tenth transistor is coupled to the first node, and a first end of the tenth transistor is coupled to the input end to receive an output signal of a shift register unit of the former stage, and a second end of the tenth transistor is coupled to an external circuit to receive a high level signal, and a control end of the eleventh transistor is coupled to the first node, and a first end of the eleventh transistor is coupled to the external circuit to receive the low level signal, and a second end of the eleventh transistor is coupled to the output end.

The tenth transistor is a P-type MOS, and the control end, the first end and the second end of the tenth transistor respectively are a gate, a source and a drain of the P-type MOS, and the eleventh transistor is a N-type MOS, and the control end, the first end and the second end of the eleventh transistor respectively are a gate, a source and a drain of the N-type MOS.

For solving the aforesaid technical issues, another solution provided by the present invention is: to provide a shift register comprising a plurality of shift register units, wherein each shift register unit comprises a storage circuit, receiving and temporarily storing a former stage signal, a voltage level control circuit and an inverter circuit, charging and discharging scan lines of a liquid crystal display panel, and a first node exists between the voltage level control circuit and the inverter circuit, and a second node exists between the storage circuit and the voltage level control circuit, and the storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal.

The storage circuit comprises an input end, a first transistor, a second transistor, a first inverter and a second inverter, and the first transistor is coupled to the input end, and a third node exists between the first transistor and the first inverter, and a control end of the first transistor is coupled to an external circuit to receive the first sequence signal, and a first end of the first transistor is coupled to the input end to receive an output signal of a shift register unit of the former stage, and a second end of the first transistor is coupled to the third node, and a control end of the second transistor is coupled to the external circuit to receive the first sequence signal, and a first end of the second transistor is coupled to the second inverter, and a second end of the second transistor is coupled to the third node.

The first transistor is a N-type MOS, and the control end, the first end and the second end of the first transistor respectively are a gate, a source and a drain of the N-type MOS, and the second transistor is a P-type MOS, and the control end, the first end and the second end of the second transistor respectively are a gate, a source and a drain of the P-type MOS.

The first inverter comprises a third transistor and a fourth transistor, and the second inverter comprises a fifth transistor and a sixth transistor, and a control end of the third transistor is coupled to the third node, and a first end of the third transistor is coupled to the external circuit to receive a high level signal, and a second end of the third transistor is coupled to the second node, and a control end of the fourth transistor is coupled to the third node, and a first end of the fourth transistor is coupled to the external circuit to receive a low level signal, and a second end of the fourth transistor is coupled to the second node, and a control end of the fifth transistor is coupled to the second node, and a first end of the fifth transistor is coupled to the external circuit to receive a high level signal, and a second end of the fifth transistor is coupled to the second end of the second transistor, and a control end of the sixth transistor is coupled to the second node, and a first end of the sixth transistor is coupled to the external circuit to receive a low level signal, and a second end of the sixth transistor is coupled to the second end of the second transistor.

The third transistor is a P-type MOS, and the control end, the first end and the second end of the third transistor respectively are a gate, a source and a drain of the P-type MOS, and the fourth transistor is a N-type MOS, and the control end, the first end and the second end of the fourth transistor respectively are a gate, a source and a drain of the N-type MOS, and the fifth transistor is a P-type MOS, and the control end, the first end and the second end of the fifth transistor respectively are a gate, a source and a drain of the P-type MOS, and the sixth transistor is a N-type MOS, and the control end, the first end and the second end of the sixth transistor respectively are a gate, a source and a drain of the N-type MOS.

The voltage level control circuit comprises a seventh transistor, an eighth transistor, and a ninth transistor, and a control end of the seventh transistor is coupled to the second node, and a first end of the seventh transistor is coupled to the second node, and a second end of the seventh transistor is coupled to the first node, and a control end of the eighth transistor is coupled to an external circuit to receive the second sequence signal, and a first end of the eighth transistor is coupled to the second node, and a second end of the eighth transistor is coupled to the first node, a control end of the ninth transistor is coupled to the external circuit to receive the second sequence signal, and a first end of the ninth transistor is coupled to the second node, and a second end of the ninth transistor is coupled to the external circuit to receive a high level signal.

The seventh transistor is a N-type MOS or a P-type MOS, and the control end, the first end and the second end of the seventh transistor respectively are a gate, a source and a drain of the N-type MOS or the P-type MOS, and the eighth transistor is a N-type MOS, and the control end, the first end and the second end of the eighth transistor respectively are a gate, a source and a drain of the N-type MOS, and the ninth transistor is a P-type MOS, and the control end, the first end and the second end of the ninth transistor respectively are a gate, a source and a drain of the P-type MOS.

The inverter circuit comprises a tenth transistor, an eleventh transistor and an output end, a control end of the tenth transistor is coupled to the first node, and a first end of the tenth transistor is coupled to the input end to receive an output signal of a shift register unit of the former stage, and a second end of the tenth transistor is coupled to an external circuit to receive a high level signal, and a control end of the eleventh transistor is coupled to the first node, and a first end of the eleventh transistor is coupled to the external circuit to receive the low level signal, and a second end of the eleventh transistor is coupled to the output end.

The tenth transistor is a P-type MOS, and the control end, the first end and the second end of the tenth transistor respectively are a gate, a source and a drain of the P-type MOS, and the eleventh transistor is a N-type MOS, and the control end, the first end and the second end of the eleventh transistor respectively are a gate, a source and a drain of the N-type MOS.

For solving the aforesaid technical issues, another solution provided by the present invention is: to provide liquid crystal display, comprising a liquid crystal display panel, a data driving circuit, employed to provide data signals to the liquid crystal display panel and a scan driving circuit employed to provide scan signals to the liquid crystal display panel, wherein the data driving circuit and the scan driving circuit respectively comprise a shift register for controlling output sequences of the data signals and the scan signals, and the shift register comprises a plurality of shift register units, and each shift register unit comprises a storage circuit, receiving and temporarily storing a former stage signal, a voltage level control circuit and an inverter circuit, charging and discharging scan lines of a liquid crystal display panel, and a first node exists between the voltage level control circuit and the inverter circuit, and a second node exists between the storage circuit and the voltage level control circuit, and the storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal.

With the aforesaid technical solutions, the benefits of the present invention are: according to the design of the embodiments of the present invention, each shift register unit merely comprises a storage circuit, a voltage level control circuit and an inverter circuit, and a first node exists between the voltage level control circuit and the inverter circuit, and a second node exists between the storage circuit and the voltage level control circuit. The storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal. Because the structure of single shift register unit becomes simpler, the occupied area of the shift register is smaller after the plurality of the shift register units is connected in series. Therefore, it is beneficial to the narrow frame or non frame design of the liquid crystal display panel. The simple structure can ensure the manufacture yield of the liquid crystal display panel more easily.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

Figure 1:
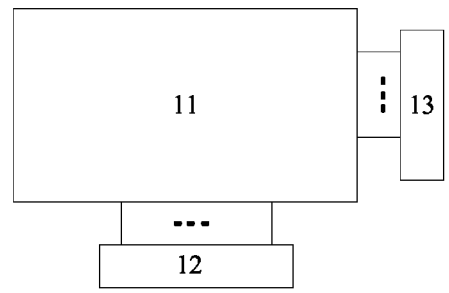
FIG. 1 is a structural diagram of a liquid crystal display according to the preferred embodiment of the present invention.

FIG. 1 is a structural diagram of a liquid crystal display according to the preferred embodiment of the present invention. As shown in FIG. 1, the liquid crystal display 10 comprises a liquid crystal display panel 11, a data driving circuit 12, employed to provide data signals to the liquid crystal display panel 11 and a scan driving circuit 13 employed to provide scan signals to the liquid crystal display panel 11. The liquid crystal display 10 utilizes the GOA (Gate Driver on Array) to manufacture the data driving circuit 12 and the scan driving circuit 13 which are respectively connected to the liquid crystal display 10 via a plurality of data lines and a plurality of scan lines corresponding thereto.

The data driving circuit 12 and the scan driving circuit 13 comprises shift registers, and control the output sequences of the data signals and the scan signals. The scan driving circuit 13 sequentially outputs high level signals to the plurality of scan lines under control of the shift register to control the conduction and switching off of the thin film transistors arrange in array column by column to realize the image display.

The shift register comprises a plurality of shift register units 20 which the structures are the same and connected in series. Please refer to FIG. 2. Each shift register unit comprises a storage circuit 31, receiving and temporarily storing a former stage signal, a voltage level control circuit 32 and an inverter circuit 33, charging and discharging the scan lines of the liquid crystal display panel 11, and a second node exists $P_2$ between the storage circuit 31 and the voltage level control circuit 32, and a first node $P_1$ exists between the voltage level control circuit 32 and the inverter circuit 33, and the storage circuit 31 is employed to selectively invert and output received level signals to the second node $P_2$ under control of a first sequence signal $CK_1$, and the voltage level control circuit 32 is employed to provide a low level signal $V_{GL}$ to the first node $P_1$, and the inverter circuit 33 is employed to selectively invert and output the low level signal $V_{GL}$ provided by the voltage level control circuit 32 under control of a second sequence signal $CK_2$. In this embodiment:

The storage circuit 31 comprises an input end V1N1, a first transistor $T_1$, a second transistor $T_2$, a first inverter 311 and a second inverter 312, and a third node $P_3$ exists between the first transistor $T_1$ and the first inverter 311, and a control end $G_1$ of the first transistor $T_1$ is coupled to an external circuit to receive the first sequence signal $CK_1$, and a first end $S_1$ of the first transistor $T_1$ is coupled to the input end V1N1 to receive an output signal of a shift register unit 20 of the former stage, and a second end $D_1$ of the first transistor $T_1$ is coupled to the third node $P_3$, and a control end $G_2$ of the second transistor $T_2$ is coupled to the external circuit to receive the first sequence signal $CK_1$, and a first end $S_2$ of the second transistor $T_2$ is coupled to the second inverter 312, and a second end $D_2$ of the second transistor $T_2$ is coupled to the third node $P_3$. The control end $G_1$ of the first transistor $T_1$ and the control end $G_2$ of the second transistor $T_2$ can be coupled to the same or different external circuits.

The first transistor $T_1$ is a N-type MOS, and the control end $G_1$, the first end $S_1$ and the second end $D_1$ of the first transistor $T_1$ respectively are a gate, a source and a drain of the N-type MOS, and the second transistor $T_2$ is a P-type MOS, and the control end $G_2$, the first end $S_2$ and the second end $D_2$ of the second transistor $T_2$ respectively are a gate, a source and a drain of the P-type MOS.

Preferably, the first inverter 311 comprises a third transistor $T_3$ and a fourth transistor $T_4$, and the second inverter 312 comprises a fifth transistor $T_5$ and a sixth transistor $T_6$ in this embodiment. Wherein:

A control end $G_3$ of the third transistor $T_3$ is coupled to the third node $P_3$, and a first end $S_3$ of the third transistor $T_3$ is coupled to the external circuit to receive a high level signal $D_3$, and a second end $D_3$ of the third transistor $T_3$ is coupled to the second node $P_2$, and a control end $G_4$ of the fourth transistor $T_4$ is coupled to the third node $P_3$, and a first end $S_4$ of the fourth transistor $T_4$ is coupled to the external circuit to receive a low level signal $V_{GL}$, and a second end $D_4$ of the fourth transistor $T_4$ is coupled to the second node $P_2$, and a control end $G_5$ of the fifth transistor $T_5$ is coupled to the second node $P_2$, and a first end $S_5$ of the fifth transistor $T_5$ is coupled to the external circuit to receive a high level signal $V_{GH}$, and a second end $D_5$ of the fifth transistor $T_5$ is coupled to the second end $D_2$ of the second transistor $T_2$, and a control end $G_6$ of the sixth transistor $T_6$ is coupled to the second node $P_2$, and a first end $S_6$ of the sixth transistor $T_6$ is coupled to the external circuit to receive a low level signal $V_{GL}$, and a second end $D_6$ of the sixth transistor $T_6$ is coupled to the second end $D_2$ of the second transistor $T_2$.

Preferably, the third transistor $T_3$ is a P-type MOS, and the control end $G_3$, the first end $S_3$ and the second end $D_3$ of the third transistor $T_3$ respectively are a gate, a source and a drain of the P-type MOS, and the fourth transistor $T_4$ is a N-type MOS, and the control end $G_4$, the first end $S_4$ and the second end $D_4$ of the fourth transistor $T_4$ respectively are a gate, a source and a drain of the N-type MOS, and the fifth transistor $T_5$ is a P-type MOS, and the control end $G_5$, the first end $S_5$ and the second end $D_5$ of the fifth transistor $T_5$ respectively are a gate, a source and a drain of the P-type MOS, and the sixth transistor $T_6$ is a N-type MOS, and the control end $G_6$, the first end $S_6$ and the second end $D_6$ of the sixth transistor $T_6$ respectively are a gate, a source and a drain of the N-type MOS in this embodiment.

Moreover, the first end $S_3$ of the third transistor $T_3$, the first end $S_4$ of the fourth transistor $T_4$, the first end $S_5$ of the fifth transistor $T_5$ and the first end $S_6$ of the sixth transistor $T_6$ can be correspondingly coupled to different external circuits. Alternatively, combinations of them can be coupled to different external circuits.

The voltage level control circuit 32 comprises a seventh transistor $T_7$, an eighth transistor $T_8$, and a ninth transistor $T_9$. A control end $G_7$ of the seventh transistor $T_7$ is coupled to the second node $P_2$, and a first end $S_7$ of the seventh transistor $T_7$ is coupled to the second node $P_2$, and a second end $D_7$ of the seventh transistor $T_7$ is coupled to the first node $P_1$, and a control end $G_8$ of the eighth transistor $T_8$ is coupled to an external circuit to receive the second sequence signal $CK_2$, and a first end $S_8$ of the eighth transistor $T_8$ is coupled to the second node $P_2$, and a second end $D_8$ of the eighth transistor $T_8$ is coupled to the first node $P_1$, a control end $G_9$ of the ninth transistor $T_9$ is coupled to the external circuit to receive the second sequence signal $CK_2$, and a first end $S_9$ of the ninth transistor $T_9$ is coupled to the second node $P_2$, and a second end $D_9$ of the ninth transistor $T_9$ is coupled to the external circuit to receive a high level signal $V_{GH}$.

Preferably, the seventh transistor $T_7$ is a N-type MOS or a P-type MOS, and the control end $G_7$, the first end $S_7$ and the second end $D_7$ of the seventh transistor $T_7$ respectively are a gate, a source and a drain of the N-type MOS or the P-type MOS, and the eighth transistor $T_8$ is a N-type MOS, and the control end $G_8$, the first end $S_8$ and the second end $D_8$ of the eighth transistor $T_8$ respectively are a gate, a source and a drain of the N-type MOS, and the ninth transistor $T_9$ is a P-type MOS, and the control end $G_9$, the first end $S_9$ and the second end $D_9$ of the ninth transistor $T_9$ respectively are a gate, a source and a drain of the P-type MOS in this embodiment.

The inverter circuit 33 comprises a tenth transistor $T_{10}$, an eleventh transistor $T_{11}$ and an output end $T_{11}$. A control end $G_{10}$ of the tenth transistor $T_{10}$ is coupled to the first node $P_1$, and a first end $S_{10}$ of the tenth transistor $T_{10}$ is coupled to the input end to receive an output signal of a shift register unit of the former stage, and a second end $D_{10}$ of the tenth transistor $T_{10}$ is coupled to an external circuit to receive a high level signal, and a control end $G_{11}$ of the eleventh transistor $T_{11}$ is coupled to the first node $G_{11}$, and a first end $S_{11}$ of the eleventh transistor $T_{11}$ is coupled to the external circuit to receive the low level signal, and a second end $D_{11}$ of the eleventh transistor $T_{11}$ is coupled to the output end VOUT.

Preferably, the tenth transistor $T_{10}$ is a P-type MOS, and the control end $G_{10}$, the first end $S_{10}$ and the second end $D_{10}$ of the tenth transistor $T_{10}$ respectively are a gate, a source and a drain of the P-type MOS, and the eleventh transistor $T_{11}$ is a N-type MOS, and the control end $G_{11}$, the first end $S_{11}$ and the second end $D_{11}$ of the eleventh transistor $T_{11}$ respectively are a gate, a source and a drain of the N-type MOS in this embodiment.

In this embodiment, the tenth transistor $T_{10}$ and the eleventh transistor $T_{11}$ construct the inverter, which is employed for charging and discharging scan lines of a liquid crystal display panel 11. The storage circuit 31 is employed for temporarily receiving and storing the electric quantity from the input end V1N1. When the first sequence signal $CK_1$ is at high voltage level, the first transistor $T_1$ is conducted and the second transistor $T_2$ is switched off. The high voltage level from the input end V1N1 can be transmitted to the third node $P_3$. After the third node $P_3$ becomes high voltage level, the first inverter 311 constructed by the third transistor $T_3$ and the fourth transistor $T_4$ can pull down the second node $P_2$ to be low voltage level. When the first sequence signal $CK_1$ is changed from high voltage level to be low voltage level, the first transistor $T_2$ is conducted and the second transistor $T_1$ is switched off. The close loop constructed by the third transistor $T_3$, the fourth transistor $T_4$, the fifth transistor $T_5$, the sixth transistor $T_6$, the second transistor $T_2$ can stably maintain the high voltage level of the third node $P_3$ and the low voltage level of second node $P_2$.

As regarding the voltage level control circuit 32, as the second sequence signal $CK_2$ is at high voltage level, the eighth transistor $T_8$ is conducted and the ninth transistor $T_9$ is switched off. The first node $P_1$ can be pulled down to the low voltage level. The first node $P_1$ outputs the high voltage level to the scan lines coupled to the shift register unit 20 after the inversion of the inverter constructed by the tenth transistor $T_{10}$ and the eleventh transistor $T_{11}$. After the second sequence signal $CK_2$ becomes low voltage level, the eighth transistor $T_8$ is switched off and the ninth transistor $T_9$ is conducted. The first node $P_1$ is pulled up to be at high voltage level by the high level signal $V_{GH}$ and outputs the low voltage level to the scan lines coupled to the shift register unit 20. In the non-charging period, the second node $P_2$ is at high voltage level, and the seventh transistor $T_7$ is conducted. The first node $P_1$ is coupled to the second node $P_2$ and stably at high voltage level to stably outputs the low voltage level to the scan lines coupled to the shift register unit 20. In the charging period, the second node $P_2$ is at low voltage level, and the seventh transistor $T_7$ is switched off. The voltage level of the first node $P_1$ and the charging to the scan lines coupled to the shift register unit 20 are not influenced.

Figure 2:
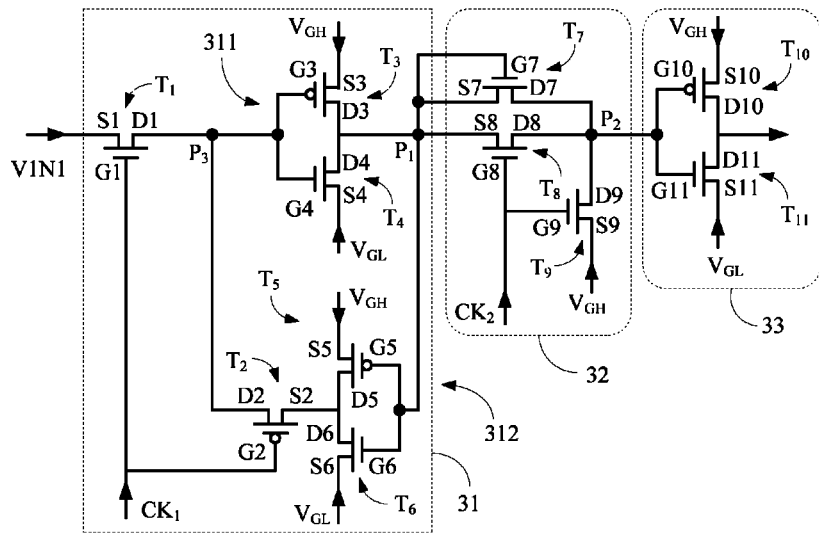
FIG. 2 is a circuit diagram of a shift register unit according to the first embodiment of the present invention.
Figure 3:
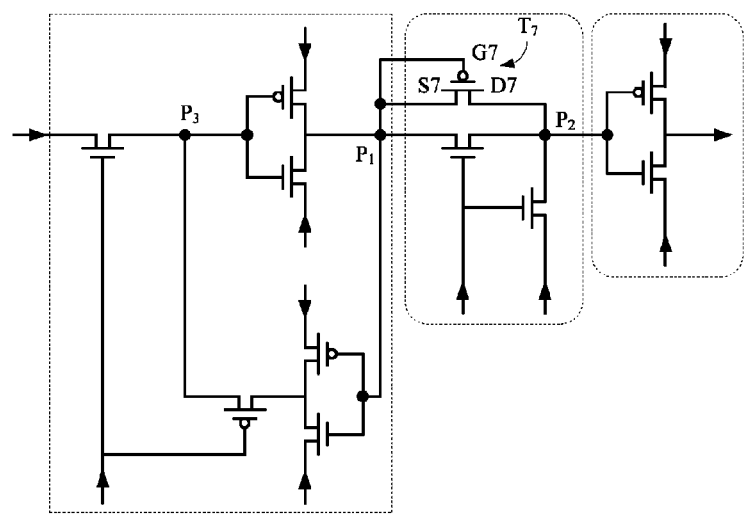
FIG. 3 is a circuit diagram of a shift register unit according to the second embodiment of the present invention.

Specifically, in other embodiments of the present invention, the seventh transistor $T_7$ can be the N-type MOS shown in FIG. 3. Then, the control end $G_7$, the first end $S_7$ and the second end $D_7$ of the seventh transistor $T_7$ respectively are a gate, a source and a drain of the N-type MOS. The difference from the embodiment shown in FIG. 2 is that in the non-charging period, the third node $P_3$ is at high voltage level and the second node $P_2$ is at high voltage level. The seventh transistor $T_7$ is conducted to ensure that the first node $P_1$ is coupled to the second node $P_2$ and stably at high voltage level in the non-charging period. Accordingly, it is achieved to stably outputs the low voltage level to the scan lines coupled to the shift register unit 20. In the charging period, the third node $P_3$ is at high voltage level and the seventh transistor $T_7$ is switched off. The charging is not influenced.

Figure 4:
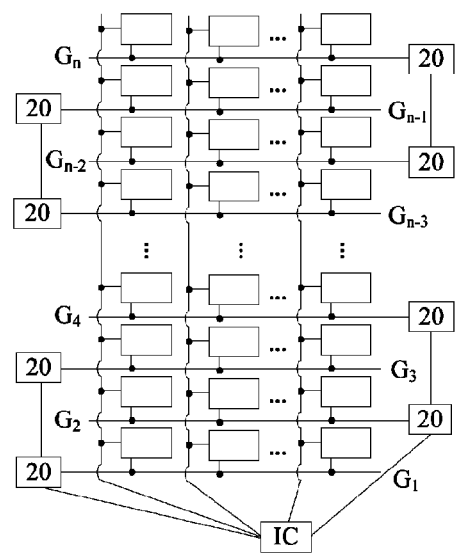
FIG. 4 is a connection diagram of the shift register unit according to the preferred embodiment in FIG. 2.

FIG. 4 is a connection diagram of the shift register unit 20 according to the preferred embodiment in FIG. 2. AS shown in FIG. 4, the shift register units 20 coupled to the odd scan lines 1,3,5, n−1 are arranged at the left side of the liquid crystal display panel 11, and the shift register units 20 coupled to the even scan lines 2,4,6, n are arranged at the right side of the liquid crystal display panel 11. Each shift register unit controls the voltage level of one horizontal scan line. For instance, the shift register unit 20 coupled to the nth scan line $G_n$ controls the voltage level of the scan line $G_n$. The shift register units 20 at the two sides of the liquid crystal display panel 11 are coupled to the drive IC under the liquid crystal display panel 11 to acquire driving signals. Two adjacent shift register units 20 are coupled with communication signal lines. Accordingly, it can be ensured that the shift register units 20 are capable of controlling the charging and discharging of the scan lines column by column.

Figure 5:
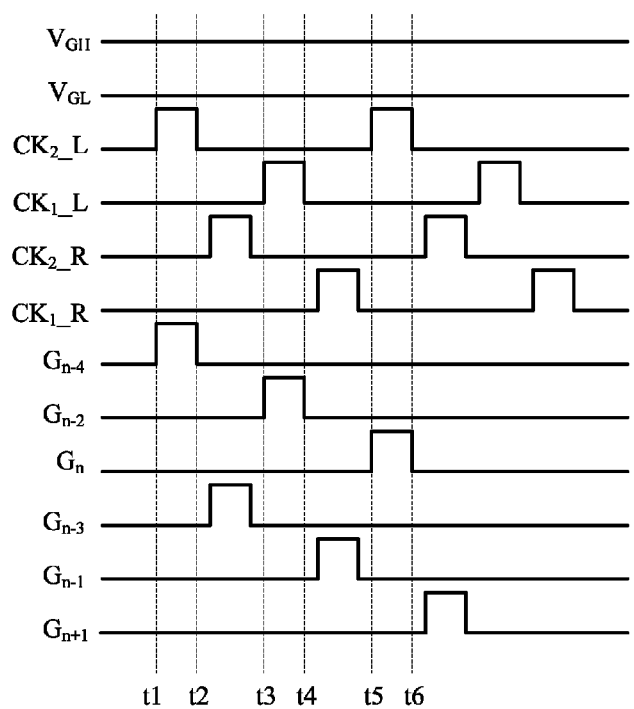
FIG. 5 is a sequence diagram of the signals applying to the shift register unit of the embodiment in FIG. 4.

FIG. 5 is a sequence diagram of the signals applying to the shift register unit of the embodiment in FIG. 4. As shown in FIG. 5, a direct current high voltage source is coupled to obtain the high level signal $V_{GH}$, and a direct current low voltage source is coupled to obtain the low level signal $V_{GL}$. $CK_1\_L$ and $CK_2\_L$ are clock signals driving the shift register units 20 at the left side of the liquid crystal display panel 11. $CK_1\_R$ and $CK_2\_R$ are clock signals driving the shift register units 20 at the right side of the liquid crystal display panel 11.

As combing what are shown in FIG. 2, FIG. 4 and FIG. 5, The t1~t3 is the preparing time before charging of the n−2th scan line $G_{n-2}$. The t3~t4 is the charging time of the scan line $G_{n-2}$. The t3~t5 is the preparing time before charging of the nth scan line $G_n$. The t3~t4 is the charging time of the scan line $G_n$. At the moment t1, the voltage levels of the $CK_2\_L$ and the scan line $G_{n-4}$ start to be raised. The third node $P_3$ of the shift register units 20 coupled to the scan line $G_{n-2}$ are charged to be high voltage level. The second node $P_2$ is pulled down to be low voltage level. At the moment t2, the voltage levels of the $CK_2\_L$ and the scan line $G_{n-4}$ are drop but the electric quantity of the storage circuit 31 in the shift register unit 20 can temporarily maintain the voltage level of the third node $P_3$ and the second node $P_2$ of the shift register unit 20 coupled to the scan line $G_{n-2}$ until the next voltage raising of the $CK_2\_L$. At the moment t3, the voltage level of the $CK_1\_L$ is raised, and the eighth transistor $T_8$ of the shift register units 20 coupled to the scan line $G_{n-2}$ is conducted and the ninth transistor $T_9$ is switched off. The first node $P_1$ is pulled down to be low voltage level by the second node $P_2$ and outputs the high voltage level via the output end VOUT to the scan line $G_{n-2}$ after the inversion of the tenth transistor $T_{10}$ and the eleventh transistor $T_{11}$. At the moment t4, the voltage level of the $CK_1\_L$ drops, and the eighth transistor $T_8$ of the shift register units 20 coupled to the scan line $G_{n-2}$ is switched off and the ninth transistor $T_9$ is conducted. Now, the first node $P_1$ of the shift register units 20 is pulled up to be high voltage level and the scan line $G_{n-4}$ is pulled down to be low voltage level. At the moment t5, the voltage level of the $CK_2\_L$ starts to be raised but the scan line $G_{n-4}$ has already been the low voltage level. The third node $P_3$ of the shift register units 20 is pulled down to be low voltage level and the second node $P_2$ is pulled up to be high voltage level.

Similarly, as shown in FIG. 5, at the moment t3, the voltage levels of the $CK_2\_L$ and the scan line $G_{n-4}$ start to be raised. The third node $P_3$ of the shift register units 20 coupled to the scan line $G_n$ are pulled up to be high voltage level. The second node $P_2$ is pulled down to be low voltage level. At the moment t5, the voltage level of the $CK_2\_L$ is pulled up, and the eighth transistor $T_8$ of the shift register units 20 coupled to the scan line $G_n$ is conducted and the ninth transistor $T_9$ is switched off. The first node $P_1$ is pulled down to be low voltage level by the second node $P_2$ and outputs the high voltage level via the output end VOUT to the scan line $G_{n-2}$ after the inversion of the tenth transistor $T_{10}$ and the eleventh transistor $T_{11}$. At the moment t6, the voltage level of the $CK_2\_L$ drops, and the eighth transistor $T_8$ of the shift register units 20 coupled to the scan line $G_n$ is switched off and the ninth transistor $T_9$ is conducted. The first node $P_1$ of the shift register units 20 is pulled up to be high voltage level and the scan line $G_n$ is pulled down to be low voltage level.

According to the aforementioned principles, the shift register units 20 correspondingly coupled to the scan lines $G_1$, $G_2$, $G_{n-1}$, $G_n$ can charge and discharge the scan lines $G_1$, $G_2$, $G_{n-1}$, $G_n$ column by column under the proper drive of the clock signals to make the liquid crystal display panel 11 normally display images.

In conclusion, according to the design of the embodiments of the present invention, each shift register unit merely comprises a storage circuit, receiving and temporarily storing a former stage signal, a voltage level control circuit and an inverter circuit, charging and discharging the scan lines of the liquid crystal display panel 11, wherein a first node exists between the voltage level control circuit and the inverter circuit, and a second node exists between the storage circuit and the voltage level control circuit. The storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal.

Because the structure of single shift register unit becomes simpler, the occupied area of the shift register is smaller after the plurality of the shift register units is connected in series. Therefore, it is beneficial to the narrow frame or non frame design of the liquid crystal display panel. The simple structure can ensure the manufacture yield of the liquid crystal display panel more easily.

Again, above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A shift register comprising a plurality of shift register units, wherein each shift register unit comprises a storage circuit, receiving and temporarily storing a former stage signal, a voltage level control circuit and an inverter circuit, charging and discharging scan lines of a liquid crystal display panel, and a first node exists between the voltage level control circuit and the inverter circuit, and a second node exists between the storage circuit and the voltage level control circuit, and the storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal;

wherein the storage circuit comprises an input end, a first transistor, a second transistor, a first inverter and a second inverter, and the first transistor is coupled to the input end, and a third node exists between the first transistor and the first inverter, and the second transistor is coupled to the second inverter, and the voltage level control circuit comprises a seventh transistor, an eighth transistor, and a ninth transistor, and the seventh transistor and the ninth transistor are coupled to the second node, and the eighth transistor is coupled to the first node, and the inverter circuit comprises a tenth transistor, an eleventh transistor and an output end, and the tenth transistor and the eleventh transistor are coupled to the first node, and a second end of the eleventh transistor is coupled to the output end.

2. The shift register according to claim 1, wherein a control end of the first transistor is coupled to an external circuit to receive the first sequence signal, and a first end of the first transistor is coupled to the input end to receive an output signal of a shift register unit of the former stage, and a second end of the first transistor is coupled to the third node, and a control end of the second transistor is coupled to the external circuit to receive the first sequence signal, and a first end of the second transistor is coupled to the second inverter, and a second end of the second transistor is coupled to the third node.

3. The shift register according to claim 2, wherein the first transistor is a N-type MOS, and the control end, the first end and the second end of the first transistor respectively are a gate, a source and a drain of the N-type MOS, and the second transistor is a P-type MOS, and the control end, the first end and the second end of the second transistor respectively are a gate, a source and a drain of the P-type MOS.

4. The shift register according to claim 2, wherein the first inverter comprises a third transistor and a fourth transistor, and the second inverter comprises a fifth transistor and a sixth transistor, and a control end of the third transistor is coupled to the third node, and a first end of the third transistor is coupled to the external circuit to receive a high level signal, and a second end of the third transistor is coupled to the second node, and a control end of the fourth transistor is coupled to the third node, and a first end of the fourth transistor is coupled to the external circuit to receive a low level signal, and a second end of the fourth transistor is coupled to the second node, and a control end of the fifth transistor is coupled to the second node, and a first end of the fifth transistor is coupled to the external circuit to receive a high level signal, and a second end of the fifth transistor is coupled to the second end of the second transistor, and a control end of the sixth transistor is coupled to the second node, and a first end of the sixth transistor is coupled to the external circuit to receive a low level signal, and a second end of the sixth transistor is coupled to the second end of the second transistor.

5. The shift register according to claim 4, wherein the third transistor is a P-type MOS, and the control end, the first end and the second end of the third transistor respectively are a gate, a source and a drain of the P-type MOS, and the fourth transistor is a N-type MOS, and the control end, the first end and the second end of the fourth transistor respectively are a gate, a source and a drain of the N-type MOS, and the fifth transistor is a P-type MOS, and the control end, the first end and the second end of the fifth transistor respectively are a gate, a source and a drain of the P-type MOS, and the sixth transistor is a N-type MOS, and the control end, the first end and the second end of the sixth transistor respectively are a gate, a source and a drain of the N-type MOS.

6. The shift register according to claim 1, wherein a control end of the seventh transistor is coupled to the second node, and a first end of the seventh transistor is coupled to the second node, and a second end of the seventh transistor is coupled to the first node, and a control end of the eighth transistor is coupled to an external circuit to receive the second sequence signal, and a first end of the eighth transistor is coupled to the second node, and a second end of the eighth transistor is coupled to the first node, a control end of the ninth transistor is coupled to the external circuit to receive the second sequence signal, and a first end of the ninth transistor is coupled to the second node, and a second end of the ninth transistor is coupled to the external circuit to receive a high level signal.

7. The shift register according to claim 6, wherein the seventh transistor is a N-type MOS or a P-type MOS, and the control end, the first end and the second end of the seventh transistor respectively are a gate, a source and a drain of the N-type MOS or the P-type MOS, and the eighth transistor is a N-type MOS, and the control end, the first end and the second end of the eighth transistor respectively are a gate, a source and a drain of the N-type MOS, and the ninth transistor is a P-type MOS, and the control end, the first end and the second end of the ninth transistor respectively are a gate, a source and a drain of the P-type MOS.

8. The shift register according to claim 1, wherein a control end of the tenth transistor is coupled to the first node, and a first end of the tenth transistor is coupled to the input end to receive an output signal of a shift register unit of the former stage, and a second end of the tenth transistor is coupled to an external circuit to receive a high level signal, and a control end of the eleventh transistor is coupled to the first node, and a first end of the eleventh transistor is coupled to the external circuit to receive the low level signal, and a second end of the eleventh transistor is coupled to the output end.

9. The shift register according to claim 8, wherein the tenth transistor is a P-type MOS, and the control end, the first end and the second end of the tenth transistor respectively are a gate, a source and a drain of the P-type MOS, and the eleventh transistor is a N-type MOS, and the control end, the first end and the second end of the eleventh transistor respectively are a gate, a source and a drain of the N-type MOS.

10. A shift register comprising a plurality of shift register units, wherein each shift register unit comprises a storage circuit, receiving and temporarily storing a former stage signal, a voltage level control circuit and an inverter circuit, charging and discharging scan lines of a liquid crystal display panel, and a first node exists between the voltage level control circuit and the inverter circuit, and a second node exists between the storage circuit and the voltage level control circuit, and the storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal.

11. The shift register according to claim 10, wherein the storage circuit comprises an input end, a first transistor, a second transistor, a first inverter and a second inverter, and the first transistor is coupled to the input end, and a third node exists between the first transistor and the first inverter, and a control end of the first transistor is coupled to an external circuit to receive the first sequence signal, and a first end of the first transistor is coupled to the input end to receive an output signal of a shift register unit of the former stage, and a second end of the first transistor is coupled to the third node, and a control end of the second transistor is coupled to the external circuit to receive the first sequence signal, and a first end of the second transistor is coupled to the second inverter, and a second end of the second transistor is coupled to the third node.

12. The shift register according to claim 11, wherein the first transistor is a N-type MOS, and the control end, the first end and the second end of the first transistor respectively are a gate, a source and a drain of the N-type MOS, and the second transistor is a P-type MOS, and the control end, the first end and the second end of the second transistor respectively are a gate, a source and a drain of the P-type MOS.

13. The shift register according to claim 11, wherein the first inverter comprises a third transistor and a fourth transistor, and the second inverter comprises a fifth transistor and a sixth transistor, and a control end of the third transistor is coupled to the third node, and a first end of the third transistor is coupled to the external circuit to receive a high level signal, and a second end of the third transistor is coupled to the second node, and a control end of the fourth transistor is coupled to the third node, and a first end of the fourth transistor is coupled to the external circuit to receive a low level signal, and a second end of the fourth transistor is coupled to the second node, and a control end of the fifth transistor is coupled to the second node, and a first end of the fifth transistor is coupled to the external circuit to receive a high level signal, and a second end of the fifth transistor is coupled to the second end of the second transistor, and a control end of the sixth transistor is coupled to the second node, and a first end of the sixth transistor is coupled to the external circuit to receive a low level signal, and a second end of the sixth transistor is coupled to the second end of the second transistor.

14. The shift register according to claim 13, wherein the third transistor is a P-type MOS, and the control end, the first end and the second end of the third transistor respectively are a gate, a source and a drain of the P-type MOS, and the fourth transistor is a N-type MOS, and the control end, the first end and the second end of the fourth transistor respectively are a gate, a source and a drain of the N-type MOS, and the fifth transistor is a P-type MOS, and the control end, the first end and the second end of the fifth transistor respectively are a gate, a source and a drain of the P-type MOS, and the sixth transistor is a N-type MOS, and the control end, the first end and the second end of the sixth transistor respectively are a gate, a source and a drain of the N-type MOS.

15. The shift register according to claim 10, wherein the voltage level control circuit comprises a seventh transistor, an eighth transistor, and a ninth transistor, and a control end of the seventh transistor is coupled to the second node, and a first end of the seventh transistor is coupled to the second node, and a second end of the seventh transistor is coupled to the first node, and a control end of the eighth transistor is coupled to an external circuit to receive the second sequence signal, and a first end of the eighth transistor is coupled to the second node, and a second end of the eighth transistor is coupled to the first node, a control end of the ninth transistor is coupled to the external circuit to receive the second sequence signal, and a first end of the ninth transistor is coupled to the second node, and a second end of the ninth transistor is coupled to the external circuit to receive a high level signal.

16. The shift register according to claim 15, wherein the seventh transistor is a N-type MOS or a P-type MOS, and the control end, the first end and the second end of the seventh transistor respectively are a gate, a source and a drain of the N-type MOS or the P-type MOS, and the eighth transistor is a N-type MOS, and the control end, the first end and the second end of the eighth transistor respectively are a gate, a source and a drain of the N-type MOS, and the ninth transistor is a P-type MOS, and the control end, the first end and the second end of the ninth transistor respectively are a gate, a source and a drain of the P-type MOS.

17. The shift register according to claim 10, wherein the inverter circuit comprises a tenth transistor, an eleventh transistor and an output end, a control end of the tenth transistor is coupled to the first node, and a first end of the tenth transistor is coupled to the input end to receive an output signal of a shift register unit of the former stage, and a second end of the tenth transistor is coupled to an external circuit to receive a high level signal, and a control end of the eleventh transistor is coupled to the first node, and a first end of the eleventh transistor is coupled to the external circuit to receive the low level signal, and a second end of the eleventh transistor is coupled to the output end.

18. The shift register according to claim 17, wherein the tenth transistor is a P-type MOS, and the control end, the first end and the second end of the tenth transistor respectively are a gate, a source and a drain of the P-type MOS, and the eleventh transistor is a N-type MOS, and the control end, the first end and the second end of the eleventh transistor respectively are a gate, a source and a drain of the N-type MOS.

19. A liquid crystal display, comprising a liquid crystal display panel, a data driving circuit, employed to provide data signals to the liquid crystal display panel and a scan driving circuit employed to provide scan signals to the liquid crystal display panel, wherein the data driving circuit and the scan driving circuit respectively comprise a shift register for controlling output sequences of the data signals and the scan signals, and the shift register comprises a plurality of shift register units, and each shift register unit comprises a storage circuit, receiving and temporarily storing a former stage signal, a voltage level control circuit and an inverter circuit, charging and discharging scan lines of a liquid crystal display panel, and a first node exists between the voltage level control circuit and the inverter circuit, and a second node exists between the storage circuit and the voltage level control circuit, and the storage circuit is employed to selectively invert and output received level signals to the second node under control of a first sequence signal, and the voltage level control circuit is employed to provide a low level signal to the first node, and the inverter circuit is employed to selectively invert and output the low level signal provided by the voltage level control circuit under control of a second sequence signal.

* * * * *